(12) United States Patent
Kimura et al.

(10) Patent No.: US 8,154,170 B2
(45) Date of Patent: Apr. 10, 2012

(54) ACOUSTIC WAVE DEVICE AND METHOD FOR MANUFACTURING THE SAME

(75) Inventors: Masanori Kimura, Yokohama (JP); Shunichi Aikawa, Yokohama (JP); Keji Tsuda, Yokohama (JP); Hikomasa Oshita, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 480 days.

(21) Appl. No.: 12/546,188

(22) Filed: Aug. 24, 2009

(65) Prior Publication Data

US 2010/0052473 A1    Mar. 4, 2010

(30) Foreign Application Priority Data

Aug. 26, 2008    (JP) .................................. 2008-217062

(51) Int. Cl.
*H01L 41/047* (2006.01)
*H03H 9/25* (2006.01)
(52) U.S. Cl. ...................... 310/313 R; 310/348; 310/365
(58) Field of Classification Search .................. 310/348, 310/313, 344, 365
See application file for complete search history.

(56) References Cited

U.S. PATENT DOCUMENTS

| | | | | |
|---|---|---|---|---|
| 6,903,497 B2 * | 6/2005 | Uchiyama et al. | ............ | 310/365 |
| 6,914,367 B2 * | 7/2005 | Furukawa | ...................... | 310/340 |
| 6,943,419 B2 * | 9/2005 | Wong et al. | .................... | 257/416 |
| 6,992,420 B2 * | 1/2006 | Jang et al. | ...................... | 310/324 |
| 7,421,767 B2 * | 9/2008 | Aoki | ........................... | 29/25.35 |
| 8,018,120 B2 * | 9/2011 | Moriya et al. | ............ | 310/313 R |
| 8,020,265 B2 * | 9/2011 | Onitsuka et al. | ............. | 29/25.35 |
| 8,058,778 B2 * | 11/2011 | Numata et al. | ................ | 310/344 |
| 2004/0032012 A1 * | 2/2004 | Wong et al. | .................... | 257/678 |
| 2009/0322186 A1 * | 12/2009 | Iwashita et al. | ............... | 310/348 |
| 2011/0193646 A1 * | 8/2011 | Sugama et al. | ............... | 331/158 |

FOREIGN PATENT DOCUMENTS

| | | | | |
|---|---|---|---|---|
| JP | 61127217 | A | * | 6/1986 |
| JP | 10022773 | A | * | 1/1998 |
| JP | 2002365152 | A | * | 12/2002 |
| JP | 2006-324894 | A | | 11/2006 |

* cited by examiner

*Primary Examiner* — Jaydi San Martin
(74) *Attorney, Agent, or Firm* — Chen Yoshimura LLP

(57) ABSTRACT

An acoustic wave device includes: a piezoelectric substrate on which an acoustic wave element and an electrode pad connected to the acoustic wave element are formed; a first resin part having a first opening located above a function area in which an acoustic wave is excited by the acoustic wave element and a second opening located above the electrode pad; a second resin part that covers the first opening and has a third opening located above the second opening; and a metal layer formed on the electrode pad in the second opening, the first opening and the second opening being inversely tapered.

10 Claims, 8 Drawing Sheets

_US 8,154,170 B2_

ACOUSTIC WAVE DEVICE AND METHOD FOR MANUFACTURING THE SAME

CROSS-REFERENCE TO RELATED APPLICATION

This application is based upon and claims the benefit of priority of the prior Japanese Patent Application No. 2008-217062, filed on Aug. 26, 2008, the entire contents of which are incorporated herein by reference.

FIELD

A certain aspect of the embodiments discussed herein is related to an acoustic wave device and a method for manufacturing the same.

BACKGROUND

An acoustic wave device may be provided in wireless communication devices, which may typically be portable phones. The acoustic wave device has an acoustic wave element formed on a piezoelectric substrate. The acoustic wave device has a function area in which an acoustic wave is excited by the acoustic wave element. Such a function area may include an interdigital transducer (IDT). An opening is defined above the function area because the acoustic wave is excited.

An acoustic wave device utilizing a wafer-level packaging scheme directed to downsizing is described in Japanese Laid-Open Patent Publication No. 2006-324894. FIG. 1 of this publication describes the following acoustic wave device. A piezoelectric substrate 100 has a function area (comb electrodes 110), which is sealed with a resin part (composed of a cavity forming layer 210 and a seal region 230) so as to define a cavity 320 above the function area. An electrode pad (pad electrode 120) electrically connected to the acoustic wave element is formed on the piezoelectric substrate. An opening is formed in the resin part above the electrode pad. The opening is full of a metal layer (electrically conductive via 430). An external circuit may be connected to the acoustic wave element via the metal layer and the electrode pad.

SUMMARY

According to an aspect of the present invention, there is provided an acoustic wave device including: a piezoelectric substrate on which an acoustic wave element and an electrode pad connected to the acoustic wave element are formed; a first resin part having a first opening located above a function area in which an acoustic wave is excited by the acoustic wave element and a second opening located above the electrode pad; a second resin part that coves the first opening and has a third opening located above the second opening; and a metal layer formed on the electrode pad in the second opening, the first opening and the second opening being inversely tapered.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An acoustic wave device related to an aspect of an embodiment will now be described. A related acoustic wave device is as described in the publication previously indicated. As has been described, the resin part covers the entire function area on the piezoelectric substrate and prevents moisture from entering into the function area. The metal layer that pierces the resin part prevents moisture from entering the function area through the metal layer. The related art has excellent moisture resistance reliability.

However, the related art is not considered in terms of the adhesive strength of the electrode pad and the metal layer and the shape of the cavity. Thus, there is a possibility that the electrode pad and the metal layer may be removed and the cavity may be deformed. These phenomena may degrade the reliability of the acoustic wave device.

According to an aspect of an embodiment of the present invention, there is provided a more reliable acoustic wave device.

[First Embodiment]

Figure 1:
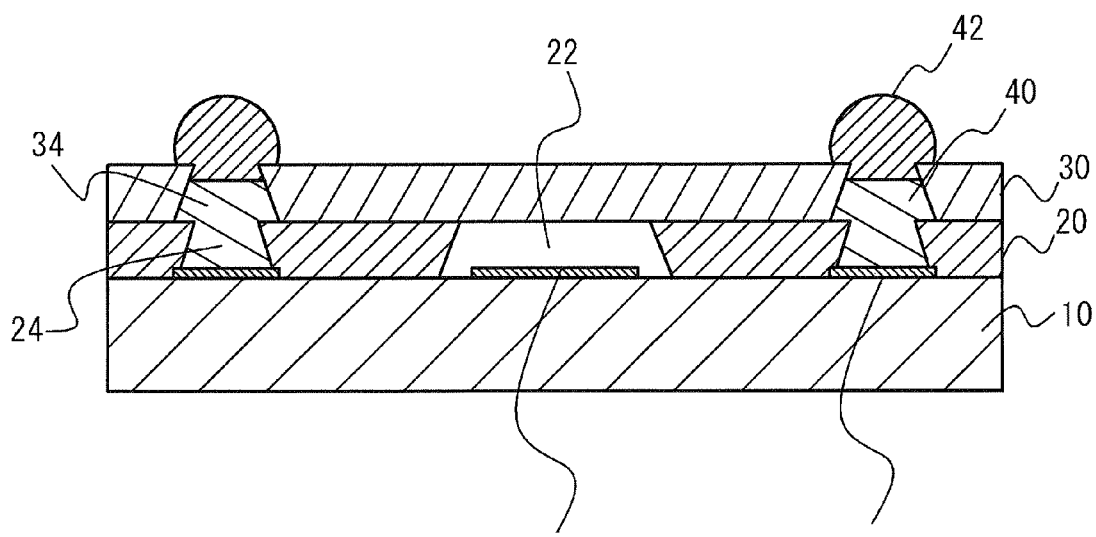
FIG. 1 is a cross-sectional view of a surface acoustic wave device in accordance with a first embodiment.

A first embodiment will now be described. FIG. 1 is a cross-sectional view of a SAW device that is an exemplary acoustic wave device in accordance with the first embodiment. The SAW device has a piezoelectric substrate 10 made of a single crystal such as lithium tantalate (LiTaO$_3$) crystal or lithium niobate (LiNbO$_3$) crystal. An acoustic wave element (IDT) 12, electrode pads 14 and interconnections may be made of a metal such as aluminum or aluminum including copper. The interconnection lines electrically connect the acoustic wave element 12 and the electrode pads 14.

A first insulative resin part 20 made of, for example, epoxy resin, is formed on the piezoelectric substrate 10. The first resin part 20 has a first opening 22 located above the function area of the acoustic wave element 12 and second openings 24 respectively located above the electrode pads 14. A second insulative resin part 30 made of, for example, epoxy resin, is formed on the first resin part 20. The second resin part 30 covers the first opening 22, and has third openings 34 respectively located above the second openings 24. Thus, the first opening 22 is the hollow cavity. A metal layer 40 made of, for example, Ni, Cu or Au, is formed on the electrode pads 14 in the second openings 24. Solder balls 42 made of, for example, SnAgCu, may be formed on the metal layer 40.

Figure 2:
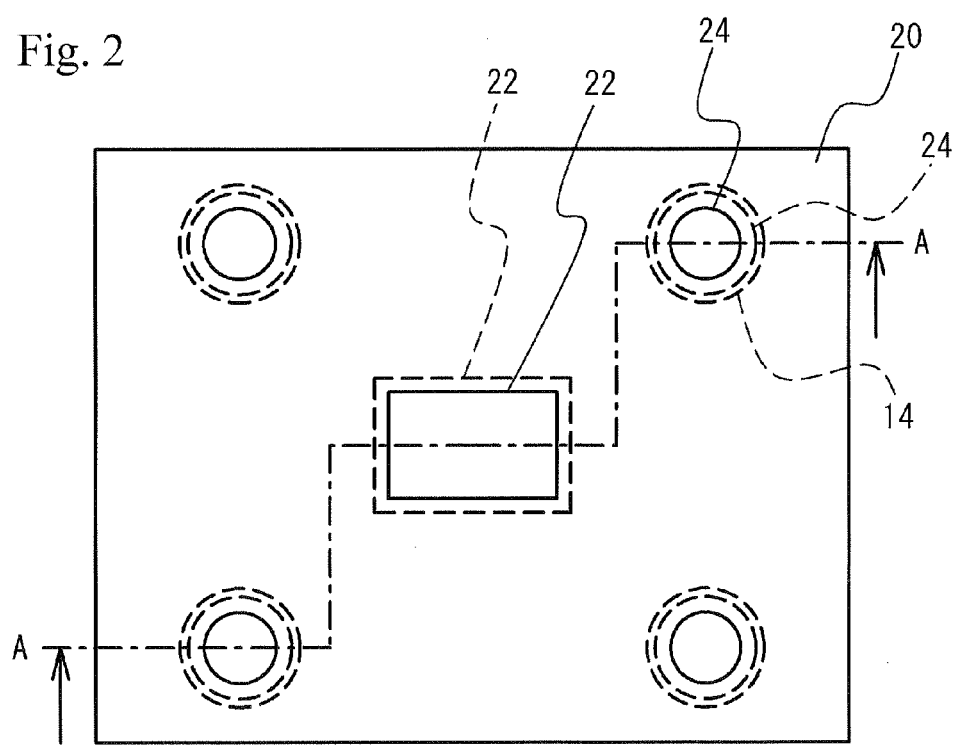
FIG. 2 is a plan view of a first resin part employed in the first embodiment.

FIG. 2 is a plan view of the first resin part 20 in which the electrode pads 14 are depicted by broken lines. Referring to FIG. 2, solid lines of the first opening 22 and the second openings 24 indicate the upper ends of the first opening 22 and the second openings 24. Broken lines of the first opening 22 and the second openings 24 indicate the lower ends of the first opening 22 and the second openings 24. FIG. 1 corresponds to a cross-section taken along a line A-A illustrated in FIG. 2. The first opening 22 has a rectangular shape viewed from the upper side of the SAW device, and the second openings 24 have a circular shape viewed from the upper side thereof. The lower end of the first opening 22 has a shape similar to that of the upper end, and the lower ends of the second openings 24 have shapes similar to those of the upper ends. The taper angles of the openings with respect to the surface of the piezoelectric substrate 10 are uniform.

Figure 3:
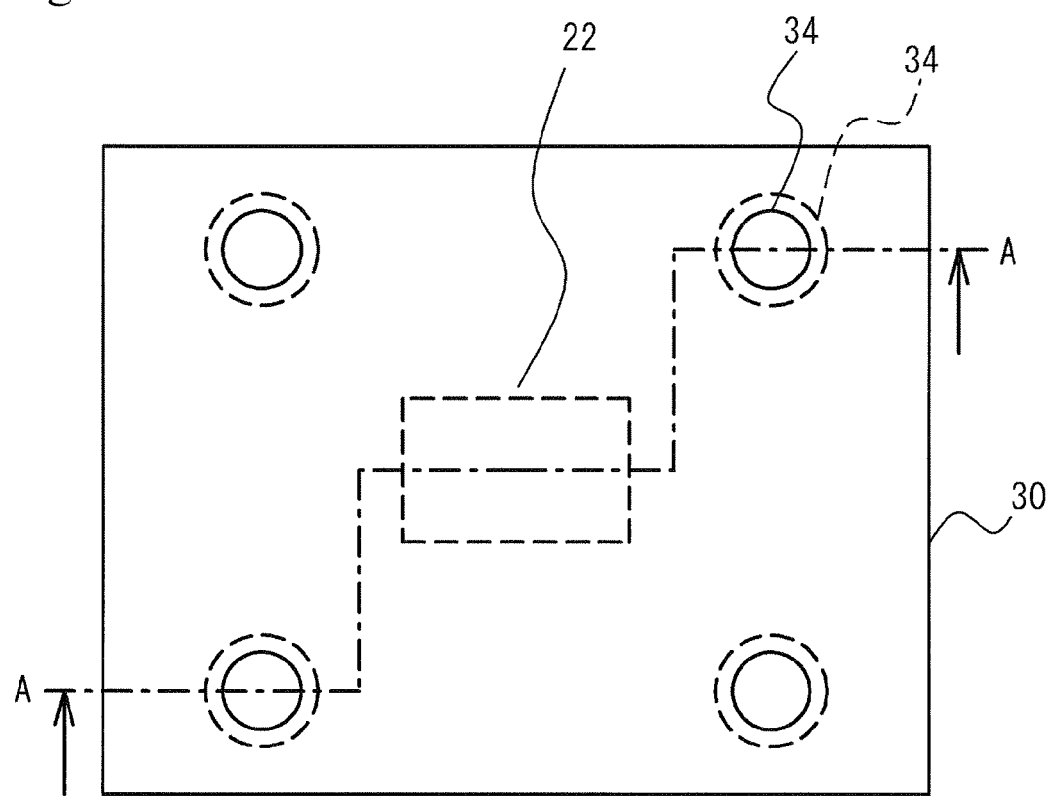
FIG. 3 is a plan view of a second resin part employed in the first embodiment.

FIG. 3 is a plan view of the second resin part 30 in which the upper end of the first opening 22 is depicted by a broken line. In FIG. 3, solid lines and broken lines of the third openings 34 are respectively the upper and lower ends of the third openings 34. FIG. 1 corresponds to a cross-section taken along a line A-A in FIG. 3. The third openings have circular shapes viewed from the upper side of the SAW device. The upper and lower ends of the third openings 34 have similar shapes. The taper angles of the third openings 34 with respect to the first resin part 20 are uniform. The first opening 22, the second openings 24 and the third openings 34 are not limited to the circular or rectangular shapes. In order to simplify the manufacturing process, it is preferable the taper angles of the openings are uniform. However, the taper angles of the openings may not be uniform.

As illustrated in FIGS. 1 through 3, the surfaces of the first resin part 20 that define the first opening 22 and the second openings 24 are inversely tapered, and the surfaces of the second resin part 30 that define the third openings 34 are inversely tapered.

Figure 4A:
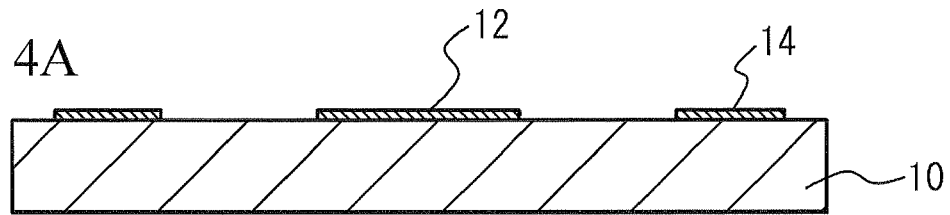
FIGS. 4A through 4D are cross-sectional views illustrating a method for manufacturing the surface acoustic wave device in accordance with the first embodiment.

A method for manufacturing the SAW device of the first embodiment will now be described. FIGS. 4A through 4D and FIGS. 5A through 5C are cross-sectional views that illustrate a method for manufacturing the SAW device in accordance with the first embodiment. Referring to FIG. 4A, an Al film or an Al—Cu film is formed on the piezoelectric substrate 10 by sputtering. The IDT of the acoustic wave element 12, the electrode pads 14 and interconnections (not illustrated) are formed by the photolithographic process and the etching process. An inorganic insulative protection film (not illustrated) is formed on the acoustic wave element 12, the electrode pads 14 and the interconnections. The inorganic insulative film may be made of a silicon compound, which may be silicon oxide ($SiO_2$), silicon nitride (SiN) or silicon oxycarbide (SiOC). The inorganic insulative protection film on the electrode pads 14 is removed by the photolithographic process and the etching process. A metal film (not depicted), which may be a Ti/Au film in which the Ti film underlies the Au film, is formed on the electrode pads 14 by the liftoff process.

Figure 4B:
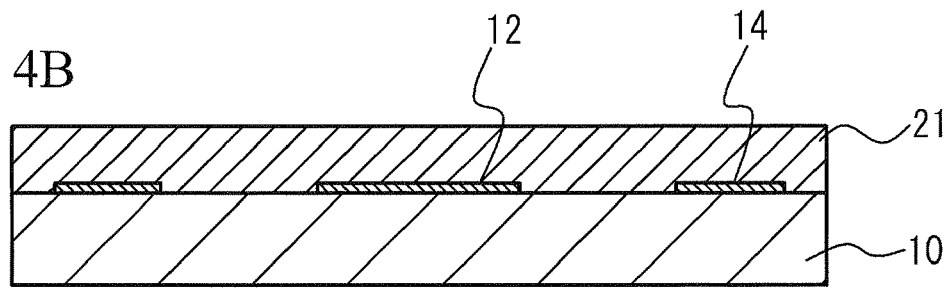
Figure 4C:
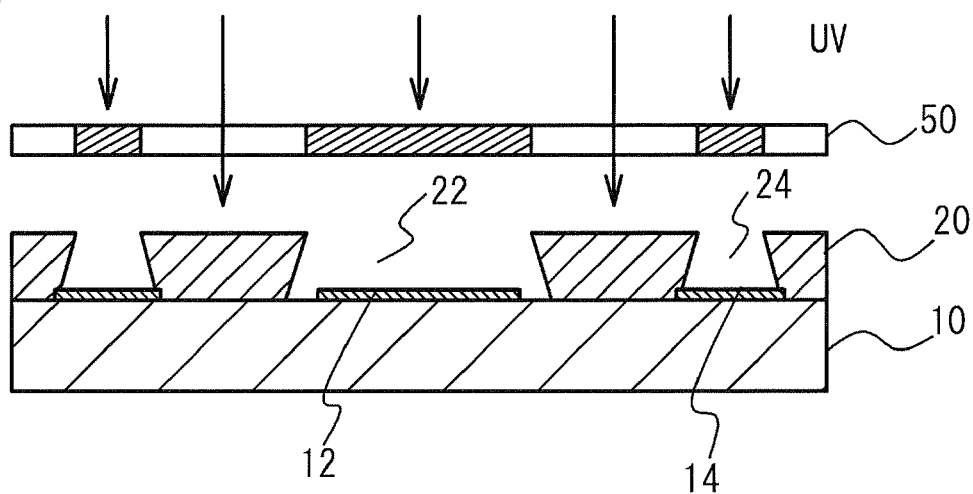
Figure 4D:
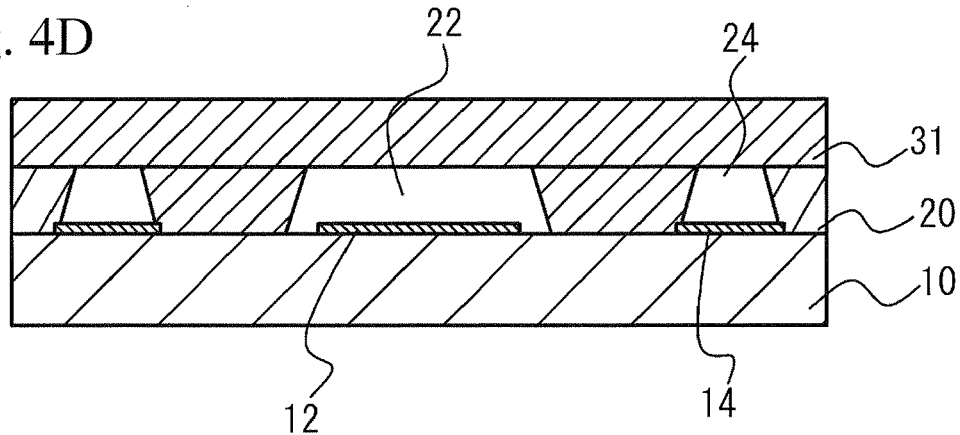

Referring to FIG. 4B, an epoxy negative permanent resist 21 is formed on the acoustic wave element 12 and the electrode pads 14 by spin coating so as to have a thickness equal to tens of microns, which may be 30 μm, for example. Referring to FIG. 4C, ultra-violet ray is projected onto the negative resist 21 with a mask 50 that prevents the ultra-violet ray from being projected onto the function area of the acoustic wave element 12, the electrode pads 14 and dicing areas (not illustrated). By developing the negative resist 21, the first resin part 20 having the first opening 22 and the second openings 24 is formed. In a case where a larger amount of projection of ultra-violet ray (the amount of development) than the appropriate amount of development is selected, the first opening 22 and the second openings 24 are inversely tapered in the first resin part 20. Referring to FIG. 4D, an epoxy negative permanent resist 31 is formed on the first resin part 20 by tenting so as to have a thickness equal to tens of microns, which may be 30 μm, for example.

Figure 5A:
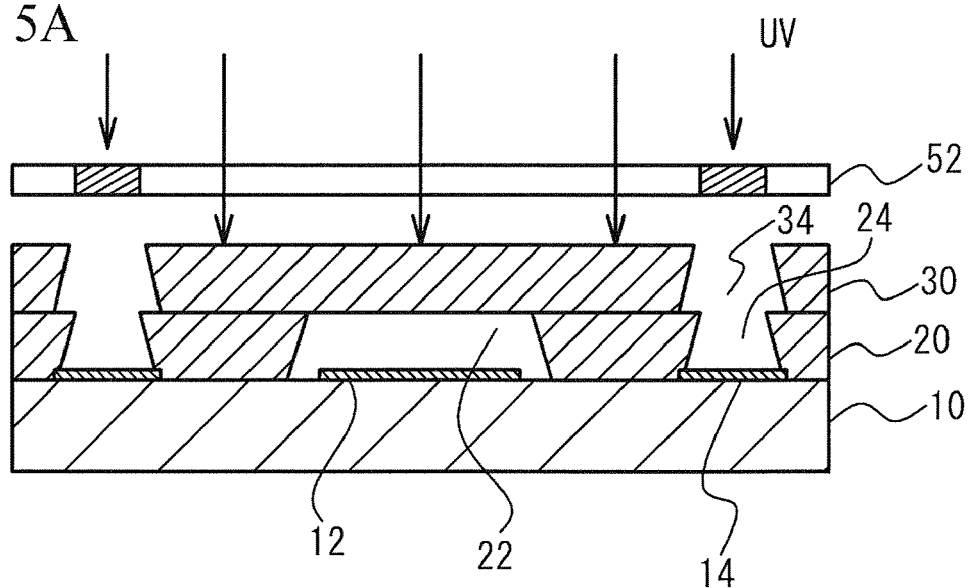
FIGS. 5A through 5C are cross-sectional views illustrating steps of the method that follow those in FIGS. 4A through 4D.
Figure 5B:
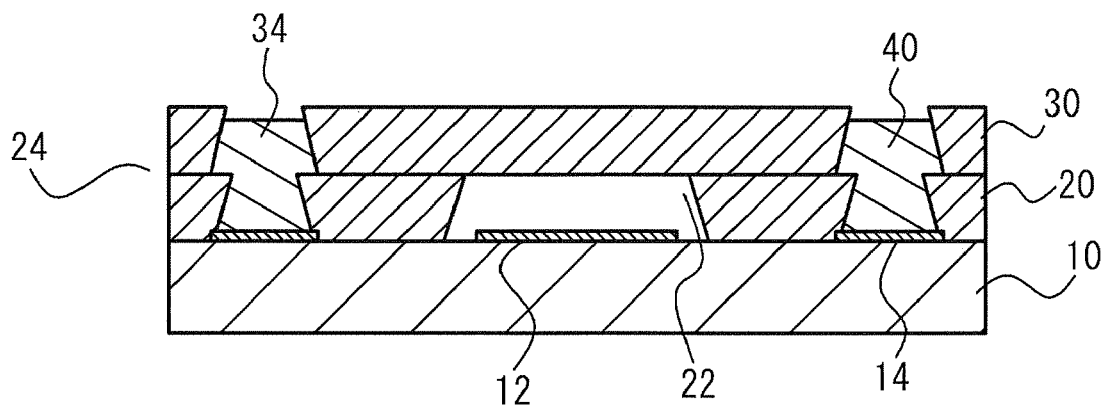
Figure 5C:
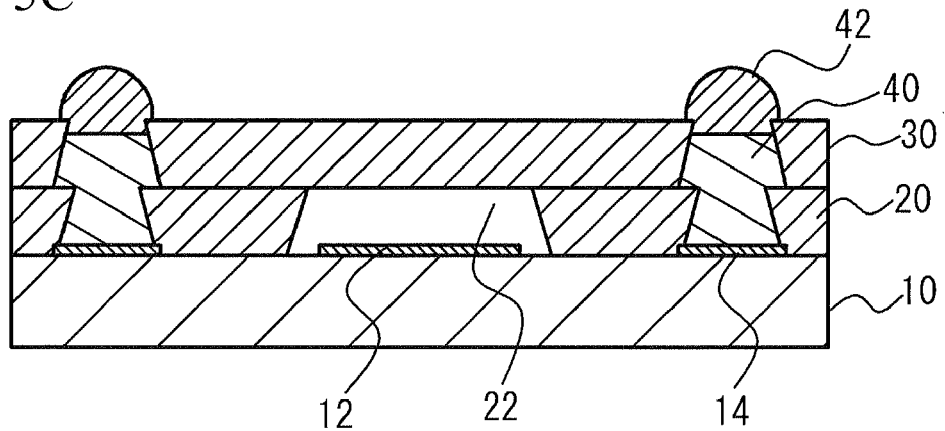

Referring to FIG. 5A, the ultra-violet ray is projected onto the negative resist 31 with a mask 52 that prevents the negative resist 31 located above the second openings 24 and the dicing areas (not illustrated) from being exposed to the ultra-violet ray. By developing the negative resist 31, the second resin part 30 having the third openings 34 is formed. In a case where a larger amount of projection of ultra-violet ray (the amount of development) than the appropriate amount of development is selected, the third openings 34 are inversely tapered in the second resin part 30. Referring to FIG. 5B, a Ni film, which may be 50 μm thick, is formed on the electrode pads 14 exposed through the second openings 24 and the third openings 34 by electrolytic plating. An Au flash plating is carried out for the Ni film. This results in the metal layer 40 on the Ni film. Referring to FIG. 5C, solder bumps made of, for example, SnAg or SnAgCu, are formed on the metal layer 40 by mask printing and are processed by reflow. Thus, the solder balls 42 are formed on the metal layer 40.

Figure 6:
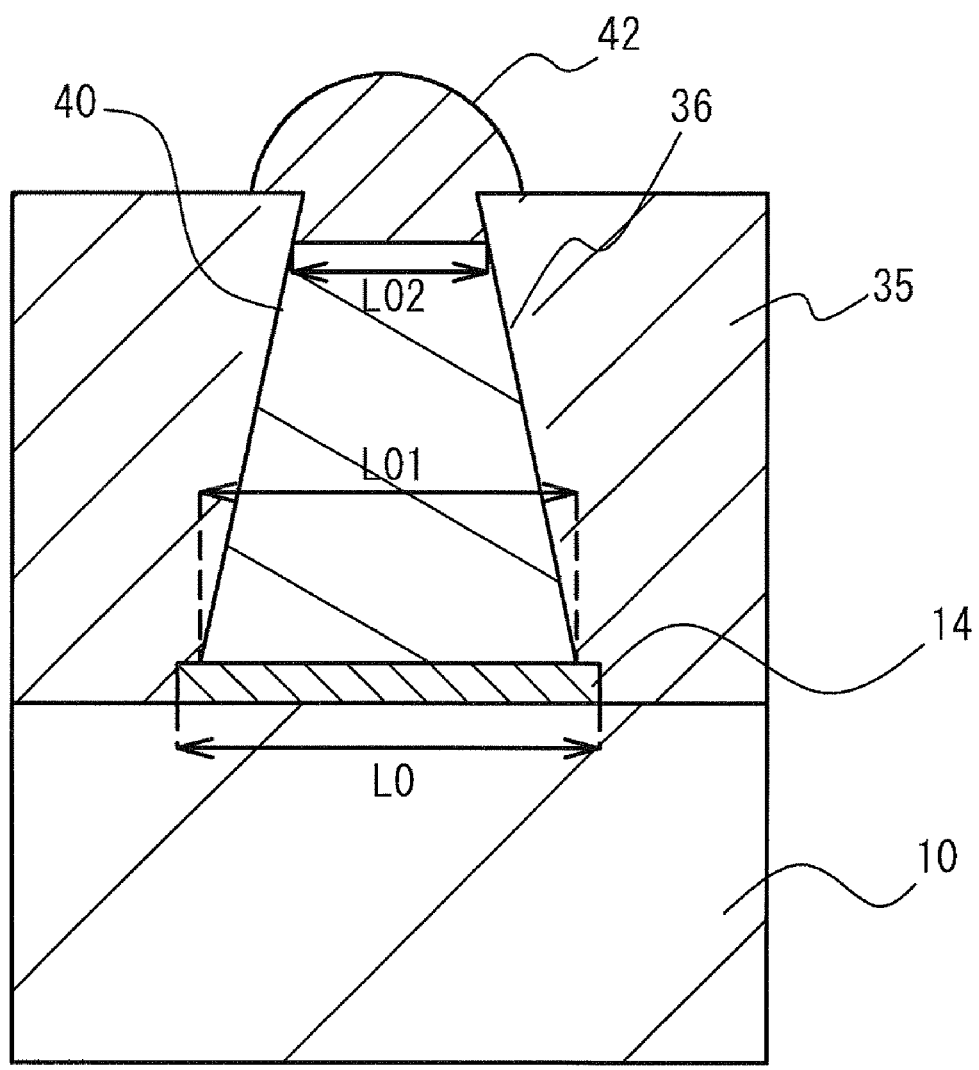
FIG. 6 is a cross-sectional view of an electrode pad and its vicinity in a comparative example.

The first embodiment has the following effects. FIG. 6 is a cross-sectional view of a part of a SAW device of a comparative example, which part includes an electrode pad. In order to increase the adhesive strength of the electrode pad 14 and the metal layer 40, it is preferable that the area of the lower end of an opening formed in a resin part 35 is greater. It is thus conceivable that, as illustrated in FIG. 6, an opening in the resin part 35 is inversely tapered so that the diameter L02 of the upper end of an opening 36 is smaller than the diameter L01 of the lower end of the opening 36. However, in a case where the diameter L02 of the upper end of the opening 36 is comparatively small, the solder ball 42 in the opening 36 is downsized, and the area for electrically connecting the metal layer 40 in the opening 36 to an external circuit is thus reduced.

Figure 7:
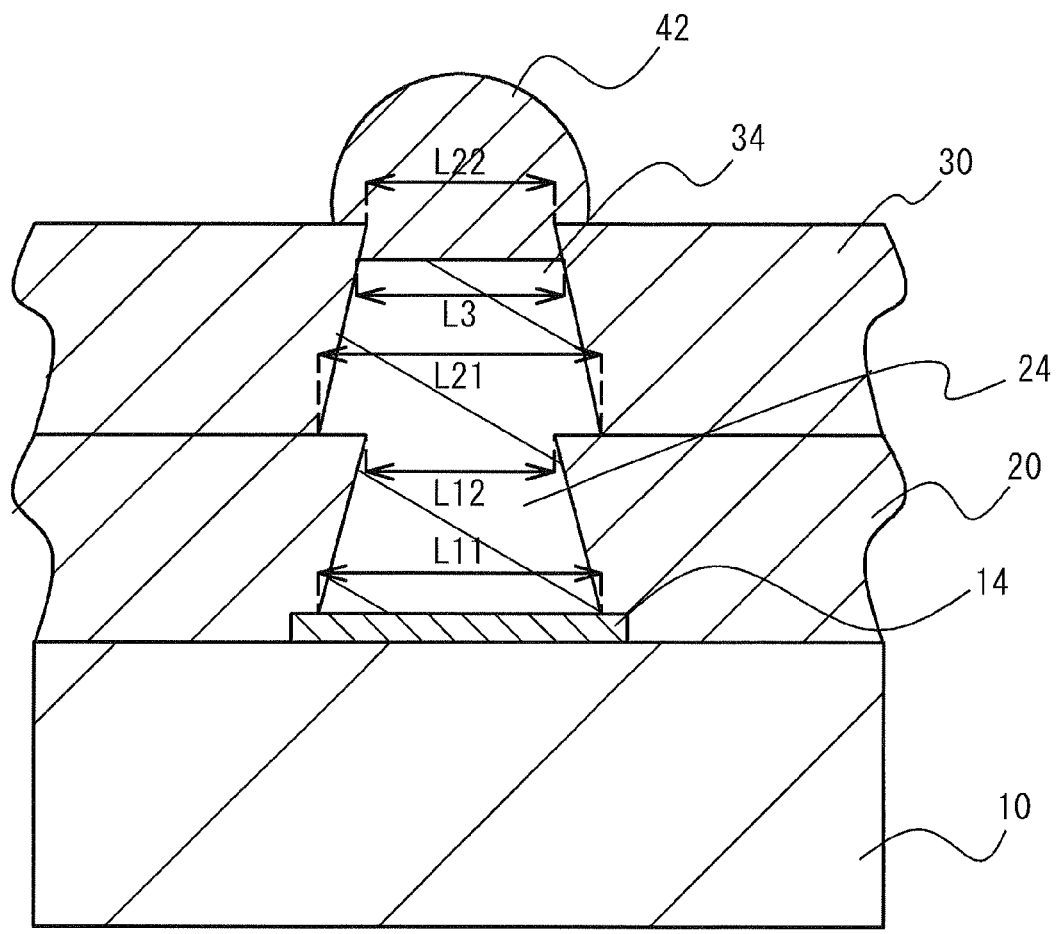
FIG. 7 is a cross-sectional view of an electrode pad and its vicinity in the first embodiment.

FIG. 7 is a cross-sectional view of a part of the SAW device in accordance with the first embodiment, which part includes the electrode pad 14. The diameter L11 of the lower end of the second opening 24 is greater than the diameter L12 of the upper end thereof. That is, the first resin part 20 and the second resin part 30 are provided, and the second opening 24 formed in the first resin part 20 is inversely tapered. It is thus possible to increase the area of the lower end of the second opening 24. In addition, since the second resin part 30 is formed on the first resin part 20, the diameter L22 of the upper end of the third opening 34 can be increased independently of the diameter of the second opening 24. It is thus possible to ensure the sufficient adhesive strength of the electrode pad 14 and the metal layer 40 and simultaneously enlarge the solder ball 42. For example, the diameter L11 may be tens of microns, and is preferably a few microns greater than the diameter L12 or more in order to reliably obtain the above effects.

The diameter L21 of the lower end of the third opening 34 is greater than the diameter L12 of the upper end of the second opening 24. That is, the area of the lower end of the third opening 34 is greater than that of the upper end of the second opening 24, and the lower end of the third opening 34 includes the upper end of the second opening 24. As compared to the comparative example illustrated in FIG. 6, the solder ball 42 can be enlarged.

In the first embodiment, the diameter L11 of the lower end of the second opening 24 and the lower end L21 of the third opening 34 are equal to each other, and the diameter L12 of the upper end of the second opening 24 and the diameter L22 of the upper end of the third opening 34 are equal to each other. It is thus possible to equalize the conditions for exposure and development in forming the second opening 24 in the first resin part 20 in FIG. 4C and the conditions for exposure and development in forming the third opening 34 in the second resin part 30 to each other.

Figure 8:
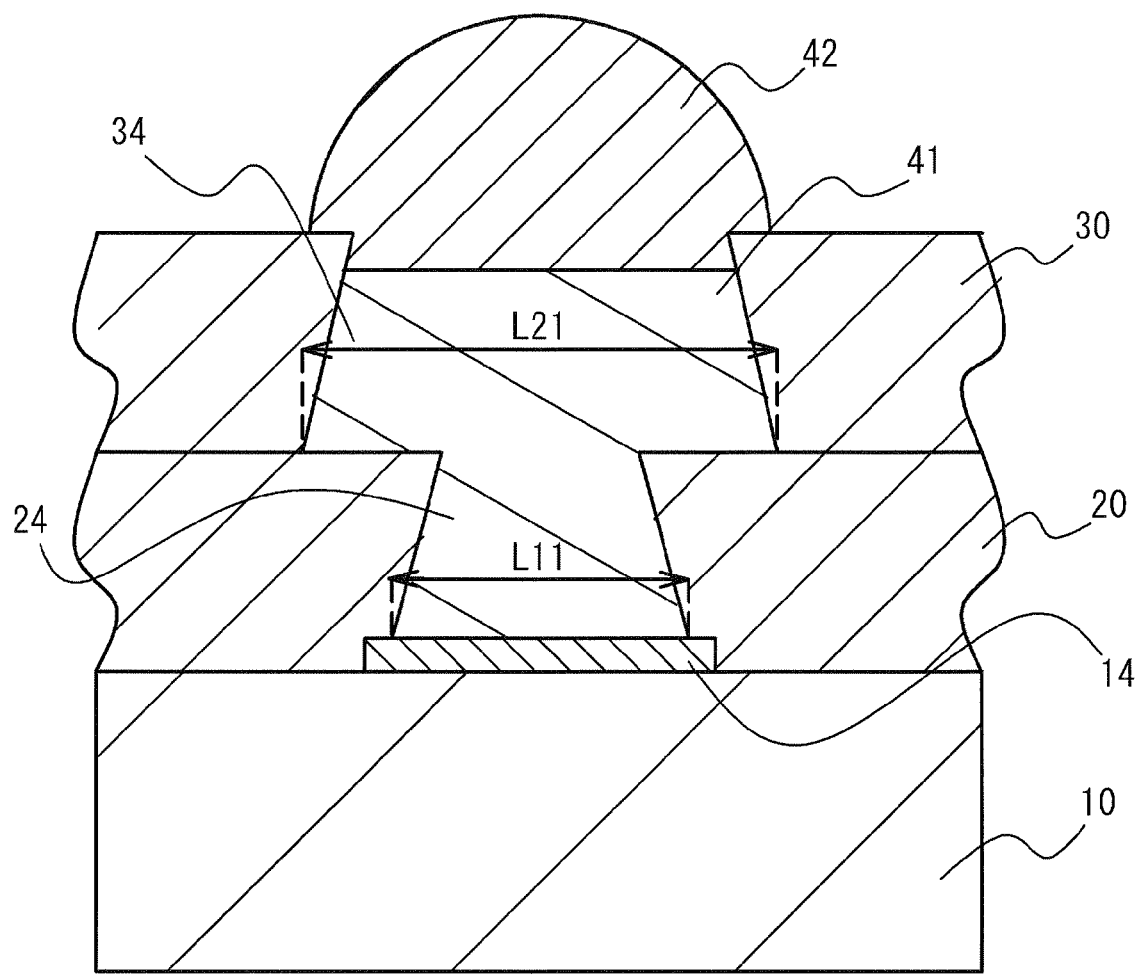
FIG. 8 is a cross-sectional view of an electrode pad and its vicinity in accordance with a first variation.

Referring to FIG. 8, the diameter L21 of the lower end of the third opening 34 is greater than the diameter L11 of the lower end of the second opening 24. That is, the area of the lower end of the third opening 34 is greater than the area of the lower end of the second opening 24, and an area obtained by projecting the lower end of the third opening 34 onto the lower surface of the first resin part 20 includes the lower end of the second opening 24. In a case where the angle of the inverse taper that defines the third opening 34 formed in the second resin 30 is equal to or smaller than the angle of the inverse taper formed in the first resin part 20, the solder ball may be further increased as compared to that of the first embodiment depicted in FIG. 7.

Further, as illustrated in FIGS. 7 and 8, the surface of the second resin part 30 that defines the third opening 34 is inversely tapered. The second opening 24 is inversely tapered and the third opening is inversely tapered. Due to the anchor effect, the adhesiveness of the metal layer 40 and the resin part can be enhanced.

Figure 9:
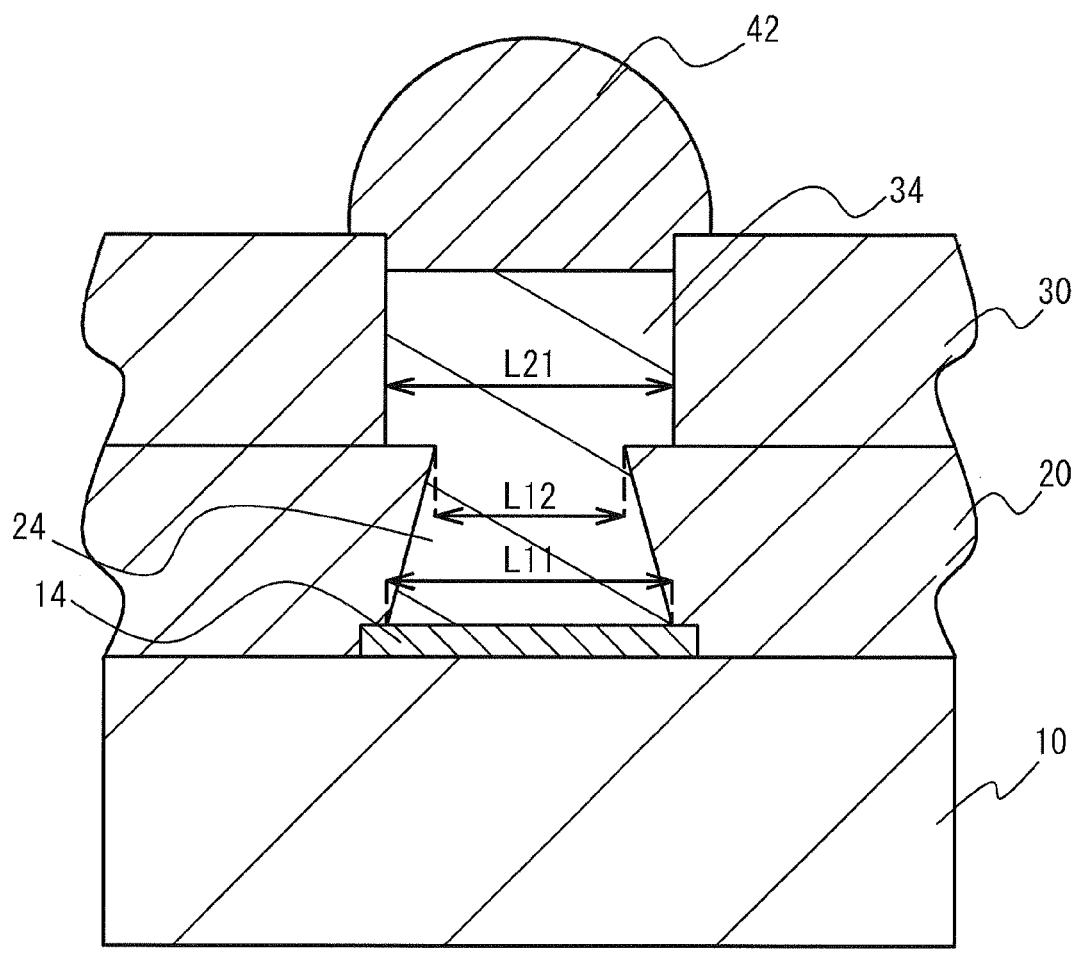
FIG. 9 is a cross-sectional view of an electrode pad and its vicinity in accordance with a second variation.

As illustrated in FIG. 9, the surface of the second resin part 30 that defines the third opening 34 may be not tapered, or may be forwardly tapered.

In the first embodiment, the surface of the first resin part 20 that defines the first opening 22 is inversely tapered. The lower end of the first opening 22 may include the corresponding function area of the acoustic wave element 12. In a case where the upper end of the first opening has a comparatively great area, the second resin part 30 may be likely to be deformed in forming the second resin part 30. For example, in FIG. 4D, a film-like resin sheet (the negative resist 31) is formed on the first resin part 20. In this case, the negative resist 31 may hang within the first opening 22. Since the first opening 22 is inversely tapered to thus reduce the area of the upper end of the first opening 22, the deformation of the second resin part 30 can be suppressed.

In terms of simplification of the manufacturing process, the first opening 22 and the second openings 24 are simultaneously formed. In this case, the first opening 22 is inversely tapered, and the second openings 24 are inversely tapered. With the above in mind, by making the areas of the third openings 34 greater than the areas of the upper ends of the second openings 24, the areas of the lower ends of the second openings 24 can be increased and the areas of the upper ends of the upper portions of the metal layer 40 can be increased.

Referring to FIG. 7, the upper surface of the metal layer 40 is preferably higher than the upper surface of the first resin part 20. It is thus possible to increase the area of the upper surface of the metal layer 40 (the diameter L3 in FIG. 7). Further, the upper surface of the metal layer 40 is preferably lower than the upper surface of the second resin part 30. It is thus possible to prevent the metal layer 40 from flowing out of the third opening 34 when the metal layer 40 is formed by plating.

In a case where the first resin part 20 is made of positive resist, a special exposure technique is utilized to define the inversely tapered openings. Such a special exposure technique may have a difficulty in thickening the first resin part 20. According to the first embodiment, the first resin part 20 is made of negative resist, which is formed on the piezoelectric substrate 10 as the negative resist 21, as illustrated in FIG. 4B. As illustrated in FIG. 4C, the negative resist is exposed to define the first opening 22 and the second openings 24. It is thus possible to inversely taper the first opening 22 and the second openings 24. Further, the second resin part 30 is made of negative resist, and the third openings 34 may be inversely tapered easily.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An acoustic wave device comprising:
   a piezoelectric substrate on which an acoustic wave element and an electrode pad connected to the acoustic wave element are formed;
   a first resin part having a first opening located above a function area in which an acoustic wave is excited by the acoustic wave element and a second opening located above the electrode pad;
   a second resin part that covers the first opening and has a third opening located above the second opening; and
   a metal layer formed on the electrode pad in the second opening,
   the first opening and the second opening being inversely tapered.

2. The acoustic wave device according to claim 1, wherein an area of a lower end of the third opening is greater than an area of an upper end of the second opening.

3. The acoustic wave device according to claim 1, wherein an area of a lower end of the third opening is greater than that of a lower end of the second opening.

4. The acoustic wave device according to claim 1, wherein a surface of the second resin part that defines the third opening is inversely tapered.

5. The acoustic wave device according to claim 1, wherein an upper surface of the metal layer is higher than an upper surface of the first resin part.

6. The acoustic wave device according to claim 1, wherein an upper surface of the metal layer is lower than an upper surface of the second resin part.

7. The acoustic wave device according to claim 1, wherein the first resin part and the second resin part include negative resist.

8. A method for manufacturing an acoustic wave device comprising:
   forming a first resin part on a piezoelectric substrate on which an acoustic wave element and an electrode pad connected to the acoustic wave element are formed, the first resin part having a first opening located above a function area in which an acoustic wave is excited by the acoustic wave element and a second opening located above the electrode pad;
   forming a second resin part on the first resin part, the second resin part covering the first opening and having a third opening located above the second opening; and forming a metal layer formed on the electrode pad in the second opening, the first opening and the second opening being inversely tapered.

9. The method according to claim 8, wherein the forming the second resin part includes forming a film-like resin sheet on the first resin part.

10. The method according to claim 8, wherein the forming the first resin part includes forming negative resist on the piezoelectric substrate, and forming the first and second openings by exposing the negative resist.

* * * * *